(12) United States Patent
Horiuchi

(10) Patent No.: US 10,418,266 B2
(45) Date of Patent: Sep. 17, 2019

(54) ELECTROSTATIC CHUCK

(71) Applicant: KYOCERA Corporation, Kyoto-shi, Kyoto (JP)

(72) Inventor: Masahiko Horiuchi, Yasu (JP)

(73) Assignee: KYOCERA Corporation, Kyoto (JP)

( * ) Notice: Subject to any disclaimer, the term of this patent is extended or adjusted under 35 U.S.C. 154(b) by 519 days.

(21) Appl. No.: 15/038,676

(22) PCT Filed: Nov. 21, 2014

(86) PCT No.: PCT/JP2014/080908
§ 371 (c)(1),
(2) Date: May 23, 2016

(87) PCT Pub. No.: WO2015/076369
PCT Pub. Date: May 28, 2015

(65) Prior Publication Data
US 2016/0300746 A1    Oct. 13, 2016

(30) Foreign Application Priority Data
Nov. 22, 2013  (JP) .................................. 2013-241907

(51) Int. Cl.
*H01T 23/00*   (2006.01)
*H01L 21/683*  (2006.01)
*H01L 21/687*  (2006.01)

(52) U.S. Cl.
CPC ...... *H01L 21/6833* (2013.01); *H01L 21/6831* (2013.01); *H01L 21/6875* (2013.01)

(58) Field of Classification Search
None
See application file for complete search history.

(56) References Cited

U.S. PATENT DOCUMENTS

| | | | |
|---|---|---|---|
| 6,413,701 B1 * | 7/2002 | van Empel | G03F 7/707 250/492.2 |
| 7,724,493 B2 | 5/2010 | Mizuno et al. | |
| 7,944,677 B2 * | 5/2011 | Aruga | C23C 14/50 361/234 |
| 9,449,865 B2 * | 9/2016 | Hilbers | G03F 7/70708 |
| 9,673,079 B2 * | 6/2017 | Baldus | H02N 13/00 |

(Continued)

FOREIGN PATENT DOCUMENTS

| | | |
|---|---|---|
| EP | 1530088 A1 | 5/2005 |
| EP | 1530089 A1 | 5/2005 |

(Continued)

OTHER PUBLICATIONS

International Search Report dated Feb. 24, 2015 and Written Opinion of the International Searching Authority issued by Japan Patent Office for International Application No. PCT/JP2014/080908.

*Primary Examiner* — Stephen W Jackson
(74) *Attorney, Agent, or Firm* — Procopio Cory Hargreaves and Savitch LLP

(57) ABSTRACT

An electrostatic chuck according to an embodiment is an electrostatic chuck for adsorbing an object. The electrostatic chuck includes a base body having a first surface that includes a bottom surface and a protruding surface part protruding from the bottom surface. The protruding surface part has a first top surface and a step surface disposed between the first top surface and the bottom surface.

8 Claims, 7 Drawing Sheets

(56) References Cited

U.S. PATENT DOCUMENTS

| | | |
|---|---|---|
| 2004/0040665 A1 | 3/2004 | Mizuno et al. |
| 2005/0122503 A1 | 6/2005 | Ottens et al. |
| 2005/0128444 A1 | 6/2005 | Ottens et al. |
| 2005/0195382 A1 | 9/2005 | Ottens et al. |
| 2006/0158823 A1 | 7/2006 | Mizuno et al. |
| 2009/0122459 A1 | 5/2009 | Mizuno et al. |
| 2010/0046134 A1 | 2/2010 | Mizuno et al. |

FOREIGN PATENT DOCUMENTS

| | | |
|---|---|---|
| EP | 2267535 A1 | 12/2010 |
| JP | 2001-219332 A | 8/2001 |
| JP | 2004-022889 A | 1/2004 |
| JP | 2010-010695 A | 1/2010 |
| JP | 2011-082579 A | 4/2011 |
| JP | 2011-199303 A | 10/2011 |

* cited by examiner

ELECTROSTATIC CHUCK

TECHNICAL FIELD

The present invention relates to an electrostatic chuck that adsorbs an object, such as a wafer or a glass substrate, when the object is subject to processing.

BACKGROUND ART

Conventionally, in a manufacturing process of, for example, a semiconductor integrated circuit or a liquid crystal display device, various kinds of apparatuses, such as an exposure apparatus or an inspection apparatus, carry out various kinds of processing of an object, such as a semiconductor wafer and a glass substrate. These apparatuses include an electrostatic chuck that adsorbs the object when the object is subject to the processing.

For example, Patent Document 1 describes an electrostatic chuck including a dielectric body (base body) having an adsorbing surface (first surface) with a convex-shaped pin (protruding surface part) and a concave part (bottom surface).

With the electrostatic chuck, the protruding surface part supports an object, thus making it possible to decrease a contact area between the electrostatic chuck and the object. This contributes to reducing contamination of the object due to particles attached to the electrostatic chuck.

PRIOR ART DOCUMENT

Patent Document

Patent Document 1: Japanese Unexamined Patent Publication No. 2001-219332

SUMMARY OF THE INVENTION

Problems to be Solved by the Invention

When the protruding surface part for supporting the object is disposed as in Patent Document 1, an electrode to generate a Coulomb's force and the bottom surface of the first surface on which a Johnson-Rahbek force occurs are relatively far away from the object. That is, when the protruding surface part is so disposed to reduce, for example, the contamination of the object, an adsorption force of the electrostatic chuck is apt to deteriorate.

Means for Solving the Problems

An electrostatic chuck according to an embodiment includes a base body having a first surface that includes bottom surface and a protruding surface part protruding from the bottom surface. The protruding surface part has a first top surface and a step surface disposed between the first top surface and the bottom surface.

Effects of the Invention

With the electrostatic chuck according to the embodiment, it is possible to relatively strongly adsorb an object by generating a relatively strong adsorption force in a region corresponding to the step surface disposed between the first top surface and the bottom surface, while reducing the contamination of the object due to particles by supporting the object through a small contact area by the first top surface of the protruding surface part when adsorbing the object.

EMBODIMENTS FOR CARRYING OUT THE INVENTION

An electrostatic chuck according to an embodiment is described in detail below with reference to FIGS. 1 to 3.

Figure 1:
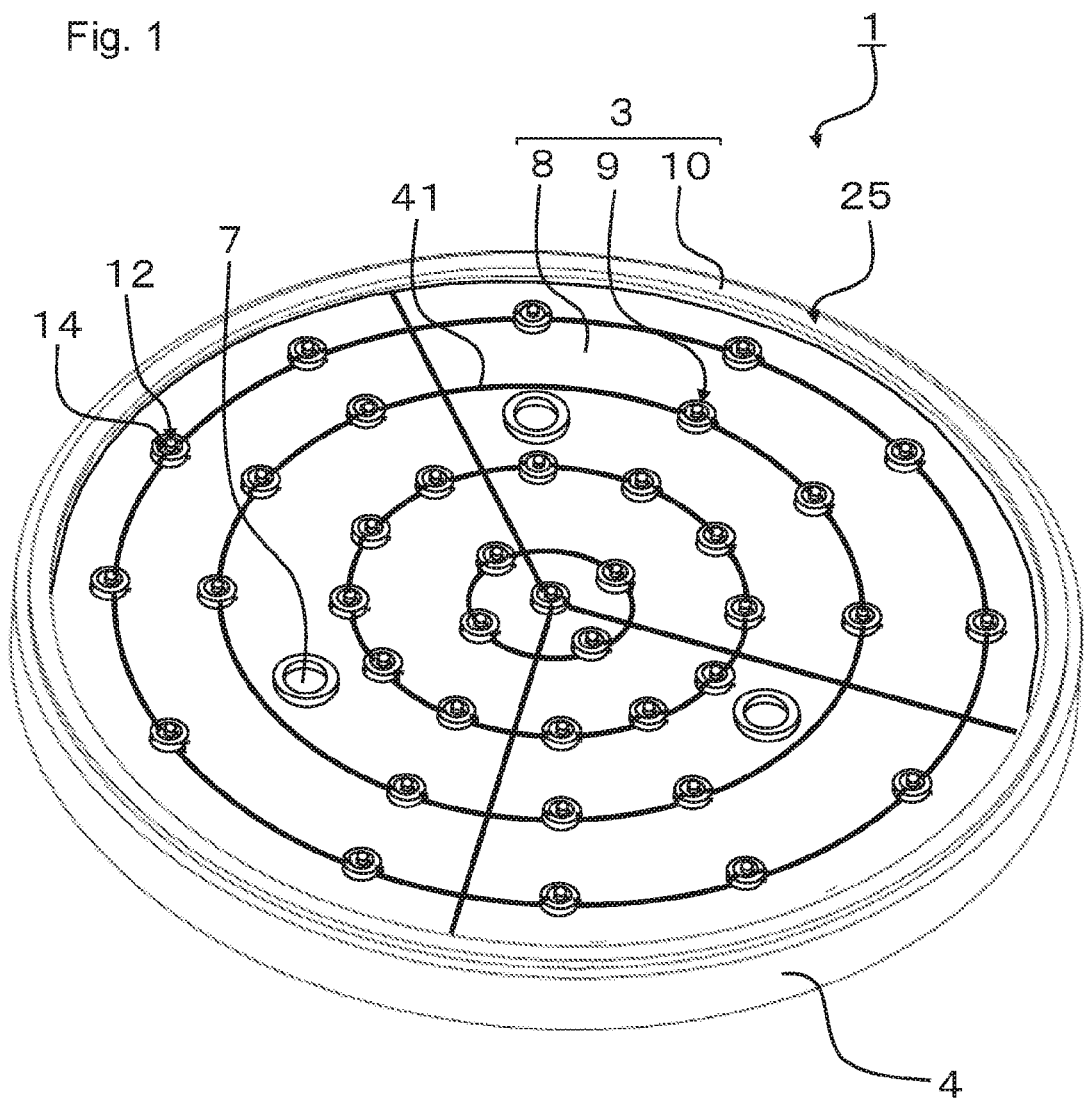
FIG. 1 is a perspective view showing an electrostatic chuck according to an embodiment.
Figure 2:
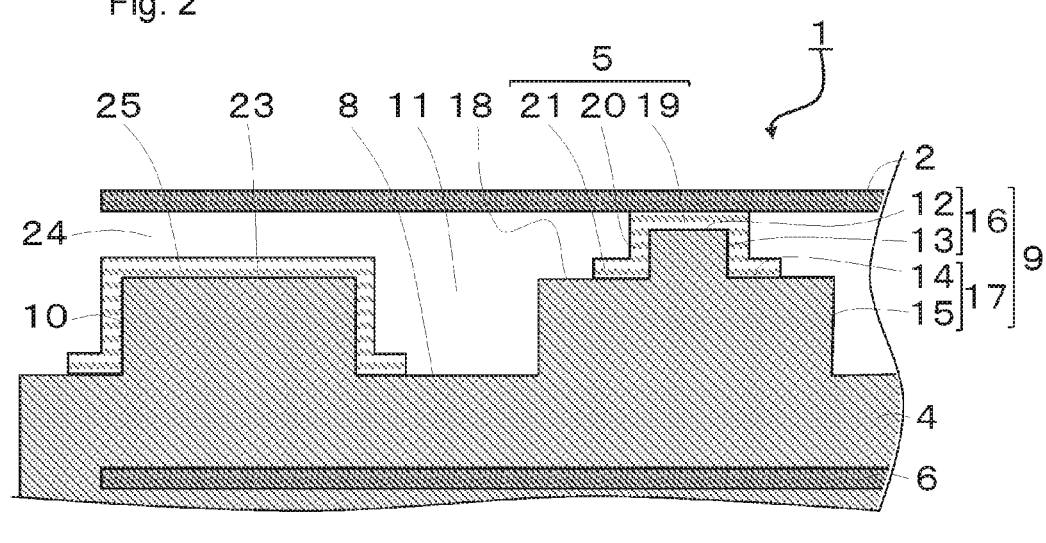
FIG. 2 is a partially enlarged view of a cross section taken along a thickness direction, which shows a situation where an object is adsorbed onto the electrostatic chuck in FIG. 1.
Figure 3:
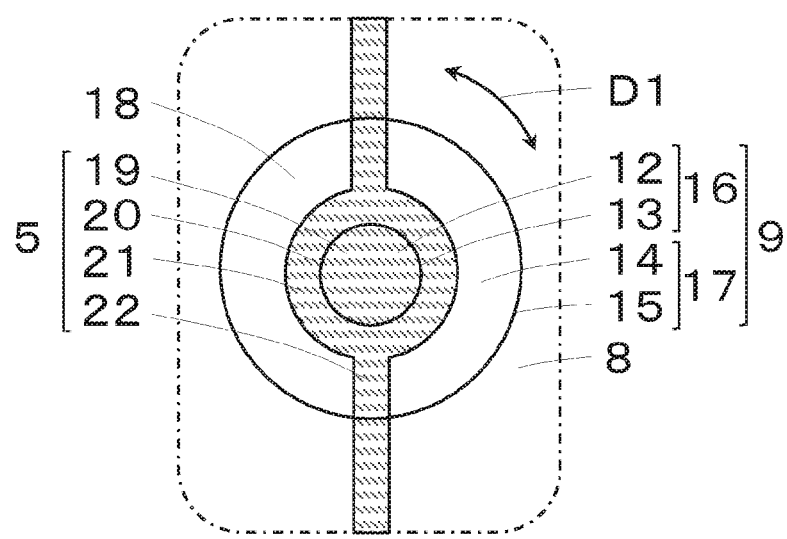
FIG. 3 is a partially enlarged view of an upper surface of a protruding surface part of the electrostatic chuck in FIG. 1.
Figure 3:
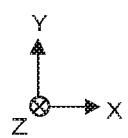

The electrostatic chuck 1 shown in FIGS. 1 and 2 constitutes various kinds of apparatuses, such as an exposure apparatus or an inspection apparatus. These apparatuses are used in a manufacturing process of, for example, a semiconductor integrated circuit or a liquid crystal display apparatus. The electrostatic chuck 1 adsorbs an object 2, such as a wafer or a glass substrate, in these apparatuses. The object 2 adsorbed by the electrostatic chuck 1 is subject to various kinds of processing in these apparatuses. For example, the exposure apparatus includes the electrostatic chuck 1 and a light source. The exposure apparatus exposes the object 2 by irradiating light from the light source to the object 2 adsorbed by the electrostatic chuck 1, thereby forming a wiring pattern.

The electrostatic chuck 1 electrostatically adsorbs the object 2 by the Johnson-Rahbek force and the Coulomb's force. As shown in FIGS. 1 and 2, the electrostatic chuck 1 includes a base body 4 having a first surface 3, a conductive film 5 that covers a part of the first surface 3, an electrode 6 disposed inside the base body 4, and an insertion hole 7 that extends through the base body 4 in a thickness direction thereof and permits insertion of a lift pin (not shown).

The electrostatic chuck 1 includes the base body 4 with the first surface 3 having a bottom surface 8 and a protruding surface part 9 that protrudes from the bottom surface 8. The protruding surface part 9 has a first top surface 12 and a step surface 14 disposed between the first top surface 12 and the bottom surface 8. The first surface 3 further has a peripheral edge convex surface part 10 that protrudes from the bottom surface 8 together with the bottom surface 8 and a plurality of the protruding surface parts 9. In other words, the base body 4 has a plat plate part, a plurality of protrusions disposed, and a convex part that is disposed on the main surface of the flat plate part and surrounds the protrusions. The protrusions have a two-step shape in a cross section taken along a thickness direction. Surfaces of the protrusions correspond to the protruding surface part 9, a top surface of an upper step corresponds to the first top surface 12, and a top surface of a lower step which surrounds the upper step corresponds to the step surface 14. The convex part has a rectangular shape in the cross section taking along the thickness direction. A surface of the convex part corresponds the peripheral edge convex surface part 10, and a top surface thereof corresponds to the second top surface 23. A region of the main surface of the flat plate part in which neither the protrusion nor the convex part is disposed corresponds to the bottom surface. The convex part extends continuously along a peripheral edge line of the bottom surface 8.

The base body 4 is composed of ceramics, such as an aluminum oxide based sintered body, an aluminum nitride based sintered body, a silicon nitride based sintered body, a cordierite based sintered body, or a silicon carbide based sintered body (SiC based or Si—SiC based one). The base body 4 is particularly preferably made of the aluminum oxide based sintered body or the aluminum nitride based sintered body. The base body 4 has a plate shape, such as a disc shape or a rectangular plate shape. The base body 4 of the present embodiment has the disc shape. A thickness of the base body 4 is, for example, 1 mm or more and 50 mm or less. A width (diameter) of the base body 4 is, for example, 50 mm or more and 3500 mm or less.

When the electrostatic chuck 1 adsorbs the object 2, a space 11 is formed between the first surface 3 of the electrostatic chuck 1 and the object 2. A fluid, such as gas, for performing a temperature control of the object 2 is supplied into the space 11. The fluid needs to be supplied into the space 11 through a flow channel (not shown) that is disposed in the base body 4 and opens into the first surface 3.

The bottom surface 8 is, for example, a flat surface. The protruding surface part 9 has the first top surface 12 and a step surface 14 disposed between the first top surface 12 and the bottom surface 8. The first top surface 2 of the protruding surface part 9 functions as a support surface to support the object 2. More specifically, the protruding surface part 9 has the first top surface 12, a first side surface 13 connected to an outer periphery of the first top surface 12, a step surface 14 connected to an end portion of the first side surface 13 which is located on the opposite side of the first top surface 12, and a second side surface 15 connected to an outer periphery of the step surface 14.

The peripheral edge convex surface part 10 has a disk shape or a polygonal shape such as a rectangular shape, in a plan view, and also has a frame shape. A part of the peripheral edge convex surface part 10 may be corrugated or partially protrude toward the inside of a frame-shaped convex part in the plan view.

The conductive film 5 covers at least a part of the first top surface 12 of the protruding surface part 9, and also partially covers the step surface 14. This reduces falling of particles from a part of the first surface 3. The conductive film 5 may not cover the step surface 14. The conductive film 5 releases, for example, an electric charge inside the object 2, which is in contact with the conductive film 5, to the outside by being grounded. The conductive film 5 is grounded by being electrically connected to a ground terminal of each of the various kinds of apparatuses.

The conductive film 5 is made of a ceramic film, a metal film, or a resin film. The ceramic film is made of a conductive ceramic material or a ceramic material having conductivity imparted thereto. The ceramic film is made of a ceramic material, such as silicon oxide, silicon nitride, titanium nitride, titanium carbide, alumina, or DLC (diamond-like carbon). The metal film is made of a metal material, such as aluminum, chrome, or gold. The resin film is made of a conductive resin material or a resin material having conductivity imparted thereto. The resin film is made of a resin material, such as a polythiophene resin or a polyacetylene resin. When used in the exposure apparatus in the manufacturing process of a semiconductor integrated circuit, an Si-based material such as silicon oxide or silicon nitride, a Ti-based material such as titanium nitride or titanium carbide, or a C-based material such as the DLC is preferably used for the conductive film 5 from the viewpoint of avoiding contamination of wafers. The conductive film is particularly preferably made of titanium nitride. This leads to enhanced wear resistance, thus making it possible to reduce occurrence of particles. A thickness of the conductive film 5 is, for example, 0.01 μm or more and 10 μm or less.

The electrode 6 has a function of causing the electrostatic chuck 1 to generate an adsorption force upon application of a voltage thereto. The electrode 6 is made of metal, such as tungsten, tungsten carbide, molybdenum, or platinum. In the electrostatic chuck 1, the electrode 6 is uniformly spread and disposed over a region corresponding to the entire surface of the first surface 3 except for a part of the peripheral edge line in a plane perspective. The electrode 6 permits selection of different shapes according to the shape of the object 2 and a desired adsorption force distribution state. For example, the electrode 6 may have a slit in a partial region, or may be partially disposed in a range corresponding to a partial region of the first surface 3 in the plane perspective. In either case, the electrode 6 is disposed at least on locations corresponding to the bottom surface 8 and the step surface 14 (overlapped locations in the plane perspective).

The adsorption of the object 2 by the electrostatic chuck 1 is carried out, for example, in the following manner. Firstly, a top surface of the lift pin inserted in the through hole 7 is moved above the first surface 3, and the object 2 is then mounted on the lift pin. Subsequently, the object 2 is brought into contact with the first top surface 12 of the protruding surface part 9 by moving the top surface of the lift pin under the first surface 3. The object 2 is then adsorbed onto the first surface 3 by causing the electrostatic chuck 1 to generate an adsorption force upon application of a voltage to the electrode 6. The object 2 is fixable by the electrostatic chuck 1 in the foregoing manner.

Thus, with the electrostatic chuck 1, the protruding surface part 9 has the first top surface 12, and the object is brought into contact with the first top surface 12, thereby decreasing the contact area between the electrostatic chuck 1 and the object 2. It is therefore possible to reduce the contamination of the object 2 due to particles generated from the base body 4 or particles attached to the base body 4. It is also possible to enhance flatness of the object 2 being adsorbed, thus leading to enhanced processing accuracy of the object 2.

The protruding surface part 9 further has the first top surface 12 and the step surface 14 disposed between the first top surface 12 and the bottom surface 8. A relatively strong adsorption force occurs between the step surface 14 and the object 2. The step surface 14 constitutes a part of the protruding surface part 9 that protrudes from the bottom surface 8. A distance between the object 2 and the step surface 14 is smaller than a distance between the object 2 and the bottom surface 8. An adsorption force due to a potential difference between the electrode 6 and the object 2 acts between the object 2 and the step surface 14, and between the object 2 and the bottom surface 8, and the object 2 is attracted to and adsorbed onto the bottom surface 8 and the step surface 14. When making a comparison between a region corresponding to the bottom surface 8 and a region corresponding to the step surface 14, the adsorption force is larger on the region corresponding to the step surface 14. This is because the step surface 14 is located closer to the object 2 than the bottom surface 8, and a relatively strong adsorption force acts between the step surface 14 and the object 2. With the electrostatic chuck 1, the relatively strong adsorption force is achievable by having the step surface 14. This reduces misregistration of the object 2 adsorbed by the electrostatic chuck 1, thereby enhancing the processing accuracy of the object 2.

The adsorption force through the step surface 14 located in the vicinity of the first top surface 12 that comes into contact with the object 2 is relatively high. It is therefore possible to relatively decrease the voltage applied to the electrode 6 while maintaining the adsorption force of the electrostatic chuck 1. This reduces leak current into the object 2, thereby preventing heat generated from the object 2 and the base body 4 due to the leak current. This reduces thermal expansion of the object 2 due to the heat, thereby enhancing the processing accuracy of the object 2.

By setting the voltage applied to the electrode 6 to be so relatively low, the adsorption force on the region corresponding to the bottom surface 8 which is located relatively far away from the first top surface 12 is settable to be relatively low. When the adsorption force on the bottom surface 8 located at the relatively far away from the first top surface 12 is relatively large, the object 2 is apt to deform, such as a deflection of the object 2 due to the adsorption force. With the electrostatic chuck 1, the protruding surface part 9 has the step surface 14 between the first top surface 12 and the bottom surface 8, thereby leading to a relatively enhanced adsorption force on the region corresponding to the step surface 14. Therefore, even when the adsorption force on the region corresponding to the bottom surface 8 is relatively lowered by setting the voltage applied to the electrode 6 to be relatively low, the electrostatic chuck 1 has a sufficiently strong adsorption force as a whole. Accordingly with the electrostatic chuck 1, the flatness of the object 2 can be enhanced by reducing the deformation of the object 2 due to the adsorption force.

The object 2 is relatively strongly adsorbed through the region corresponding to the step surface 14. Therefore, the object 2 is relatively strongly pressed against the first top surface 12, and a friction force between the first top surface 12 and the object 2 is large. With the electrostatic chuck 1, the misalignment of the object 2 adsorbed by the electrostatic chuck 1 is suitably reducible by the friction force.

As described above, the fluid, such as the gas, for performing the temperature control of the object 2 is supplied into the space 11. The temperature of the object 2 being adsorbed is controllable by heat exchange with the gas or the like. Meanwhile a flow of the gas allows, for example, microparticles or the like to move along the gas in the space 11. It is important that no particle is attached to between the object 2 and the first top surface 12 and in the vicinity thereof in order to control with high precision a posture (angle or the like) of the object 2 being adsorbed. With the electrostatic chuck 1, the protruding surface part 9 has the step surface 14, and the distance between the step surface 14 and the object 2 is narrow in the region corresponding to the step surface 14, thus making it difficult for the gas to enter there. That is, with the electrostatic chuck 1, the region corresponding to the step surface 14 functions a static pressure seal, thereby preventing particles from approaching the first top surface 12. Although the gas for the temperature control hardly enters the region corresponding to the step surface 14, the step surface 14 is disposed at a position closer to the object 2 than the bottom surface 8. It is therefore possible to control the temperature of the object 2 by radiant heat from the step surface 14. In the electrostatic chuck 1, the step surface 14 is disposed so as to surround the first top surface 12 in the plan view, thus making it possible to more surely reduce particles that approach the first top surface 12.

The protruding surface part 9 is made up of a first section 16 having on a surface thereof the first top surface 12 and the first side surface 13, and a second section 17 having the step surface 14 and the second side surface 15. A protrusion portion whose surface is the protruding surface part 9 is a two-step protrusion. Alternatively, the protrusion portion may be formed in a protrusion shape with three or more steps, and the protruding surface part 9 may be configured to have a plurality of the step surfaces 14.

An inclination angle of the step surface 14 with respect to the first top surface 12 is smaller than an inclination angle of the first side surface 13 with respect to the first top surface 12. The step surface 14 is preferably approximately parallel to the first top surface 12. The inclination angle of the step surface 14 with respect to the first top surface 12 is, for example, 0° or more and 3° or less.

The electrostatic chuck 1 includes the conductive film 5 that covers at least the part of the first top surface 12 and partially covers the step surface 14. The description that "partially covers the step surface 14" implies a state in which one or more portions of the step surface 14 is exposed without being covered with the conductive film 5 as shown in FIGS. 2 and 3. That is, the step surface 14 has an exposed part 18 that is exposed without being covered with the conductive film 5. The conductive film 5 so covers at least the part of the first top surface 12. It is therefore possible to bring at least a partial region of the first top surface 12 into a potential of the conductive film 5 (namely, a ground potential) by grounding the conductive film 5. For example, by grounding the conductive film 5 with a voltage applied to the electrode 6, a section corresponding to the conductive film 5 can be so configured as not to generate any adsorption force to adsorb the object 2. Additionally, the conductive film 5 covers at least the part of the first top surface 12, thereby reducing the falling of particles on the first top surface 12. This makes it possible to reduce the contamination of the object 2 due to the particles, and also enhance the flatness of the object 2.

The conductive film 5 does not necessarily need to be grounded because the adsorption force is reducible only by having the conductive film 5. Even in this case, it is preferable to ensure that an electric charge that has reached the conductive film 5 is quickly released to the outside through the conductive film 5 by grounding the conductive film 5 after the adsorption. For example, a connection switching part, such as a switch, may be disposed between the conductive film 5 and the ground potential. For example, when an electric charge is already stored in the object 2 when carrying out adsorption, the electric charge that has stored in the object 2 can be quickly released to the outside by grounding the conductive film 5. This reduces time to separate the object 2 from the electrostatic chuck 1, thereby enhancing processing speed of the object 2 by each of the various kinds of apparatuses.

A voltage for adsorbing the object 2 is applied to the electrode 6 with the conductive film 5 grounded. On that occasion, the conductive film 5 have the ground potential, and hence any force to adsorb the object 2 does not occur in the region corresponding to the conductive film 5. Whereas the step surface 14 has the exposed part 18 being exposed from the conductive film 5. The region corresponding to the exposed part 18 is exposed from the conductive film 5, and hence an adsorption force occurs. The exposed part 18 of the step surface 14 is closer to the object 2 than the bottom surface 8, and hence the adsorption force in the region corresponding to the exposed part 18 is relatively large. Thus, with the electrostatic chuck 1, the adsorption force on the first top surface 12 brought into contact with the object 2 is reduced by the conductive film 5, thereby reducing damage to the first top surface 12 due to the object 2, and occurrence of particles due to the damage or the like. Meanwhile, by partially covering or not covering the step surface 14, the exposed part 18 is disposed on the step surface 14, and the relatively strong adsorption force is achieved in the vicinity of the first top surface 12. The conductive film 5 covers the entirety of the first top surface 12. Alternatively, the conductive film 5 may cover only a part of the first top surface 12.

The first side surface 13 surrounds the first top surface 12 over a circumferential direction D1. The conductive film 5 has a first region 19 that covers at least a part of the first top surface 12, and a second region 20 that covers the first side surface 13 over the circumferential direction D1 and is connected to the first region 19. This makes it possible to electrically connect the first region 19 via the second region 20 to a ground. Additionally, the second region 20 covers the first side surface 13 over the circumferential direction D1 and is connected to the first region 19. This enhances connection strength between the first region 19 and the second region 20. This makes it possible to reduce a disconnection between the first region 19 and the second region 20. The second region 20 covers the first side surface 13 over the circumferential direction D1, thus making it possible to reduce falling of particles on the first side surface 13 adjacent to the object 2.

The conductive film 5 further has a third region 21 that covers a region of the step surface 14 which is close to the first side surface 13 over the circumferential direction D1, and is connected to the second region 20. It is consequently possible to electrically connect the second region 20 via the third region 21 to the ground. Additionally, because the third region 21 covers the region of the step surface 14 which is close to the first side surface 13 over the circumferential direction D1, and is connected to the second region 20, it is possible to enhance connection strength between the second region 20 and the third region 21. This makes it possible to reduce a disconnection between the second region 20 and the third region 21.

The conductive film 5 further has a line-shaped fourth region 22 that covers a part of a region of the step surface 14 other than the region close to the first side surface 13, and is connected to the third region 21. It is consequently possible to electrically connect the third region 21 via the fourth region 22 to the ground. By forming the fourth region in the line shape, the region of the exposed part 18 in the step surface 14 can be increased to enhance the adsorption force of the first surface 3 with respect to the object 2.

In the electrostatic chuck 1, a plurality of protruding surface parts 9 protrude from the bottom surface 8, and the fourth region 22 of each of the protruding surface parts 9 is connected to the fourth region of one or more others of the protruding surface parts 9. The fourth regions 22 of the protruding surface parts 9 are electrically connected to one another via a wiring line 41 formed on the bottom surface 8. With this configuration, the conductive films 5 disposed on the protruding surface parts 9 are electrically connectable in a small wiring area. In the electrostatic chuck 1, all of the conductive films 5 of the protruding surface parts 9 are electrically connected to one another, and all of the conductive films 5 of the protruding surface parts 9 can be grounded at the same time by grounding one portion electrically connected to the conductive films 5.

A distance (height of the first section 16) between the first top surface 12 and the step surface 14 in a height direction (Z direction) of the protruding surface part 9 is 0.05 μm or more and 10 μm or less. Consequently, by setting the distance to 10 μm or less, the distance between the step surface 14 and the object 2 can be sufficiently decreased to enhance the adsorption force through the step surface 14. By setting the distance to 0.05 μm or more, it is possible to prevent the distance between the step surface 14 and the first top surface 12 from becoming too small, and also cause the step surface 14 to generate an adsorption force. In order to sufficiently enhance the adsorption force through the step surface 14 while preventing the distance between the step surface 14 and the first top surface 12 from becoming too small, the distance between the first top surface 12 and the step surface 14 in the protruding surface part 9 is more preferably 1 μm or more and 3 μm or less.

Similarly to the second top surface 23 described later, it is possible to make the step surface 14 function as a static pressure seal, thereby reducing deterioration of the flatness of the object 2 due to particles falling from the step surface 14 close to the object 2. When the step surface 14 functions as the static pressure seal, the gas for the temperature control is less apt to enter. However, the distance between the step surface 14 and the object 2 is small, thereby achieving a satisfactory temperature control of the object 2 by radiant heat.

A height of the first top surface 12 in the protruding surface part 9 (a distance between the first top surface 12 and the bottom surface 8 in the height direction of a protrusion) is, for example, 3 μm or more and 50 μm or less. Because the height of the first top surface 12 is 3 μm or more, the space 11 between the object 2 and the bottom surface 8 can be increased to achieve a satisfactory temperature control of the object 2 by the gas distributed into the space 11. A height of the step surface 14 in the protruding surface part 9 (a distance between the step surface 14 and the bottom surface 8 in the height direction of the protrusion) is, for example, 1 μm or more and 49 μm or less. A width (diameter) of the first top surface 12 is, for example, 0.03 mm or more and 10 mm or less. A width of the step surface 14 (a distance between an inner periphery and an outer periphery in the step surface 14) is, for example, 0.01 mm or more and 9.97 mm or less.

A width of the third region 21 in the conductive film 5 (a distance between an inner periphery and an outer periphery in the third region 21) is, for example, 0.001 mm or more and 8.00 mm or less. A width of the exposed part 18 in the step surface 14 (a distance between an inner periphery and an outer periphery in the exposed part 18) is, for example, 0.001 mm or more and 9.97 mm or less.

The first surface 3 has the peripheral edge convex surface part 10 that is disposed so as to surround a plurality of protrusions and protrudes from the bottom surface 8. It is possible to prevent the gas in the space 11 from leaking to the outside by having the peripheral edge convex surface part 10. The peripheral edge convex surface part 10 has the second top surface 23. A height of the second top surface 23 from the bottom surface 8 is smaller than a height of the first top surface 12 from the bottom surface 8. By ensuring a micro difference in height between the first top surface 12 and the second top surface 23, a micro gap that is a space is formed between the object 2 and the second top surface 23. Because the micro gap 24 is so micro, an amount of movement of the fluid, such as air, is extremely small. Therefore, the micro gap 24 functions as the static pressure seal, thereby preventing, for example, the gas from leaking from the space 11 between the object 2 and the first surface 3. Furthermore, a gap occurs between the object 2 and the second top surface 23 by the micro gap 24, and the gap reduces a contact therebetween, thereby preventing an inclination of the object 2 caused by the contact. It is therefore possible to enhance the flatness of the object 2, thus leading to enhanced processing accuracy of the object 2.

Regarding an entire width of the peripheral edge convex surface part 10, a distance between the outer periphery and the inner periphery is, for example, 0.01 mm or more and 5 mm or less. A width of the peripheral edge convex surface part 10 is larger than the width of the protruding surface part 9. The entire width of the peripheral edge convex surface part 10 may be the same as or different from the entire width of the protruding surface part 9.

The peripheral edge convex surface part 10 has the second top surface 23 whose height from the bottom surface 8 is the same as that of the step surface 14 of the protruding surface part 9. That is, a distance between the second top surface 23 and the bottom surface 8 in the height direction of the protruding surface part 9 is the same as a distance between the step surface 14 and the bottom surface 8 in the height direction of the protruding surface part 9. The height of the second top surface 23 is the same as the height of the step surface 14, and it is therefore possible to form the second top surface 23 and the step surface 14 by simultaneous processing as described later. An error of the height of the second top surface 23 with respect to the height of the step surface 14 is within ±25%.

A thickness of the micro gap 24 is, for example, 0.5 μm or more and 20 μm or less. Owing to the fact that thickness of the micro gap 24 is 0.5 μm or more, it is possible to further reduce the contact between the object 2 and the second top surface 23. Owing to the fact that thickness of the micro gap 24 is 20 μm or less, it is possible to prevent, for example, the gas from leaking from the space 11 between the object 2 and the first surface 3. The thickness of the micro gap 24 is preferably 1 μm or more and 3 μm or less.

The electrostatic chuck 1 has a second conductive film 25 that covers at least a part of the second top surface 23. The second conductive film 25 is electrically connected to the conductive film 5. When the conductive film 5 is grounded, similarly to the top surface 12 covered with the conductive film 5, the second top surface 23 covered with the second conductive film 25 does not generate any force to adsorb the object 2. Also when the conductive film 5 is not grounded, similarly to the first top surface 12 covered with the conductive film 5, the force to adsorb the object 2 is reducible. This makes it possible to reduce the deformation of the object 2 caused by the adsorption force of the second top surface 23, thus leading to the enhanced flatness of the object 2. Additionally, the falling of particles on the second top surface 23 is reducible. The conductive film 25 covers the entirety of the second top surface 23. Alternatively, the second conductive film 25 and the conductive film 5 may not be electrically connected to each other. Also in this case, the second conductive film 25 and the conductive film 5 produce similar effects to the foregoing embodiment by grounding each of the second conductive film 25 and the conductive film 5.

The second conductive film 25 covers a side surface of the peripheral edge convex surface part 10 and the region of the bottom surface 8 which is close to the peripheral edge convex surface part 10. A thickness of the second conductive film 25 is identical to a thickness of the first region 20 of the conductive film 5. Accordingly, a thickness of the micro gap 24 corresponds to the distance between the first top surface 12 and the second top surface 23.

A method of manufacturing the electrostatic chuck 1 is described in detail below with reference to FIGS. 4 to 6.

Figure 4A:
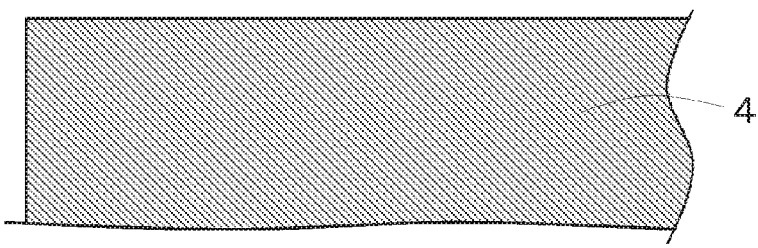
FIGS. 4(a) to 4(e) are partially enlarged views of a cross section taken along the thickness direction, which respectively describe a method of manufacturing the electrostatic chuck in FIG. 1.

(1) The base body 4 is prepared as shown in FIG. 4(a). Specifically, this is carried out, for example, in the following manner.

Firstly, deionized water and an organic binder are added to a ceramic powder, and this is then wet-mixed in a ball mill, thereby obtaining a slurry. Subsequently, ceramic particles are produced by granulating the slurry by spray drying. Then, a formed body is produced by forming the ceramic particles with various forming methods. On that occasion, an electrode paste is formed inside the formed body. The formed body is producible by applying the electrode paste to a tape produced by subjecting the ceramic particles to tape forming, and then laminating another tape on the electrode paste. Subsequently, the formed body is made into a desired shape by subjecting the formed body to a cutting process. A ceramic sintered body is formed by firing the resulting formed body at, for example, 1000° C. or above and 2300° C. or below. On that occasion, the electrode 6 is formed by simultaneously firing the electrode paste and the formed body. Thereafter, the base body 4 having a desired shape is manufactured by subjecting the ceramic sintered body to a polishing process.

(2) The protruding surface part 9 and the peripheral edge convex surface part 10 are formed on the surface of the base body 4 as shown in FIG. 4(b) to FIG. 5(d). Specifically, this is carried out, for example, in the following manner.

Figure 4B:
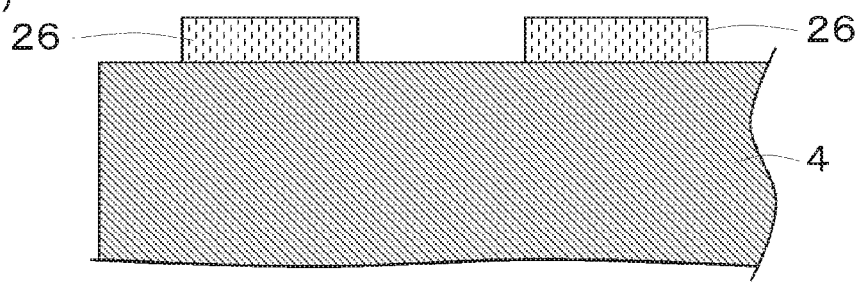
Figure 4C:
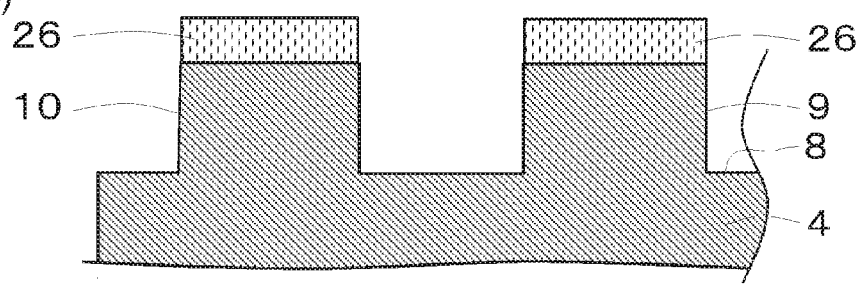

As shown in FIG. 4(b), a first resist 26 made of a photocuring resin or the like is formed by using a photolithography method, which covers regions of the base body 4 that respectively correspond to the protruding surface part 9 and the peripheral edge convex surface part 10. Then, as shown in FIG. 4(c), portions exposed from the first resist 26 are cut by using a blasting process, thereby forming a base section that becomes the bottom surface 8 and the protruding surface part 9, and a base section that becomes the peripheral edge convex surface part 10. Thereafter, the first resist 26 is removed from the base body 4. On that occasion, a height of the base section serving as the protruding surface part 9 and a height of the base section serving as the peripheral edge convex surface part 10 are the same.

Figure 4D:
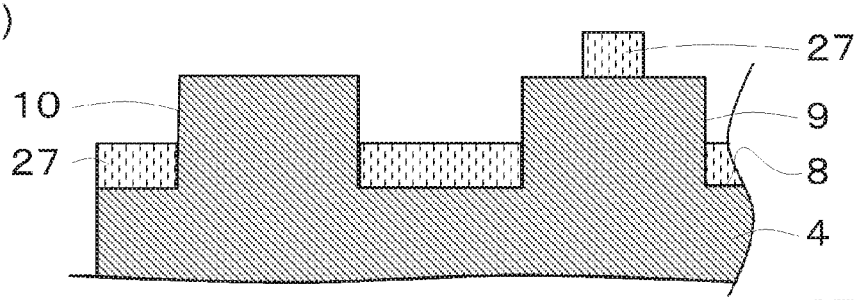
Figure 4E:
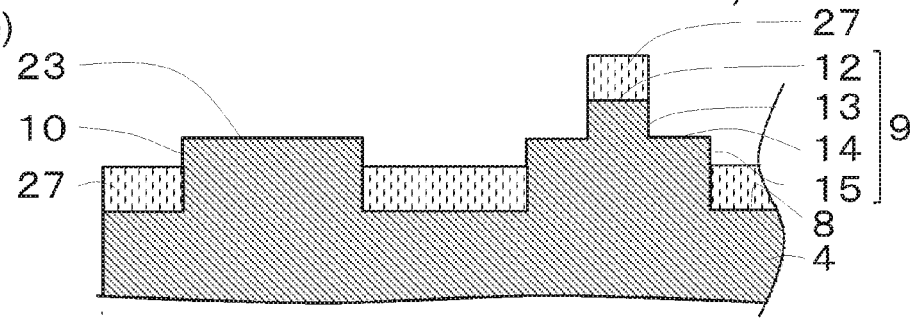

Subsequently, as shown in FIG. 4(d), a second resist 27 made of a photocuring resin or the like is formed by using the photolithography method, which covers regions of the base body 4 that respectively correspond to the bottom surface 8 and the first top surface 12 on the first surface 3 of the base body 4. Then, as shown in FIG. 4(e), portions exposed from the first resist 27 are cut by using a blasting process, thereby forming the first top surface 12, the first side surface 13, the step surface 14, and the second side surface 15 on the protruding surface part 9, as well as the second top surface 23 on the peripheral edge convex surface part 10. On that occasion, a height of the second top surface 23 of the peripheral edge convex surface part 10 is smaller than a height of the first top surface 12 of the protruding surface part 9. Thereafter, the second resist 27 is removed from the base body 4.

Thus, the first surface 3 including the bottom surface 8, the protruding surface part 9, and the peripheral edge convex surface part 10 is formable on the base body 4.

Alternatively, the first surface 3 including the bottom surface 8, the protruding surface part 9, and the peripheral edge convex surface part 10 may be formed, for example, in the following manner.

Figure 5A:
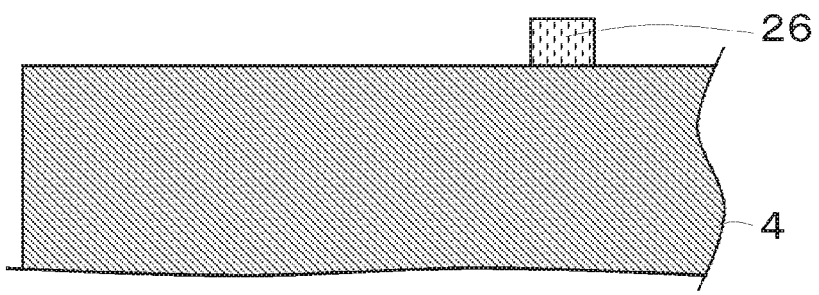
FIGS. 5(a) to 5(d) are partially enlarged views of a cross section taken along the thickness direction, which respectively describe a method of manufacturing the electrostatic chuck in FIG. 1.

Firstly, as shown in FIG. 5(a), a first resist 26 made of a photocuring resin or the like is formed by using the photolithography method, which covers a region of a surface of the base body 4 that corresponds to the first top surface 12 of the protruding surface part 9.

Figure 5B:
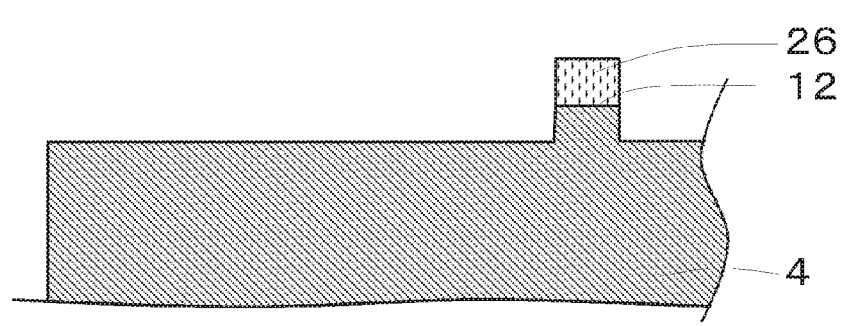

Then, as shown in FIG. 5(b), a portion exposed from the first resist 26 is cut by using the blasting process, thereby forming the first section 16 of the protruding surface part 9. Thereafter, the first resist 26 is removed from the base body 4.

Figure 5C:
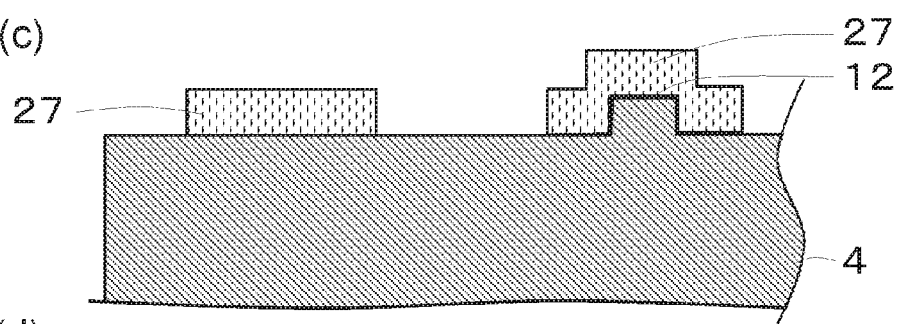

Subsequently, as shown in FIG. 5(c), a second resist 27 made of a photocuring resin or the like is formed by using the photolithography method, which covers regions corresponding to the first top surface 12, the first side surface 13, the step surface 14, and the second top surface 23 on the surface of the base body 4.

Figure 5D:
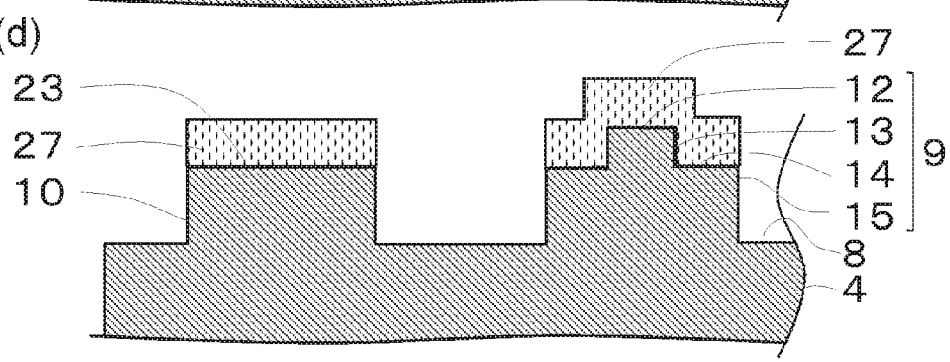

Then, as shown in FIG. 5(d), portions exposed from the first resist 27 are cut by using the blasting process, thereby forming the protruding surface part 9 having the first top surface 12, the first side surface 13, the step surface 14, and the second side surface 15, and the peripheral edge convex surface part 10 having the second top surface 23. Thereafter, the second resist 27 is removed from the base body 4.

Thus, the first surface 3 including the bottom surface 8, the protruding surface part 9, and the peripheral edge convex surface part 10 is formable on the base body 4.

The step surface 14 of the protruding surface part 9 and the second top surface 23 of the peripheral edge convex surface part 10 are formed by a simultaneous processing. This ensures enhanced production efficiency of the electrostatic chuck 1 while making the step surface 14 and the second top surface 23 have the same height.

Figure 6A:
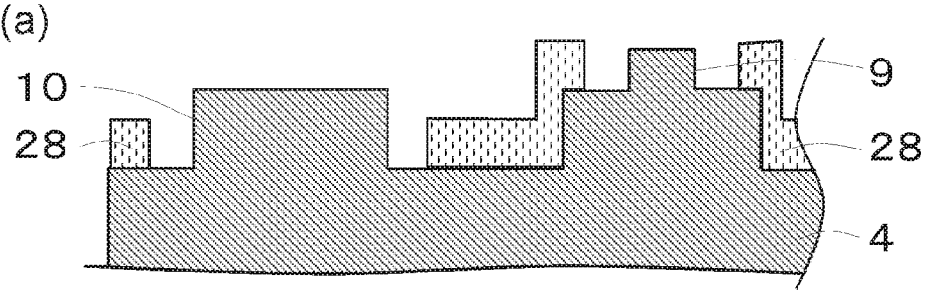
FIGS. 6(a) to 6(c) are partially enlarged views of a cross section taken along the thickness direction, which respectively describe a method of manufacturing the electrostatic chuck in FIG. 1.
Figure 6B:
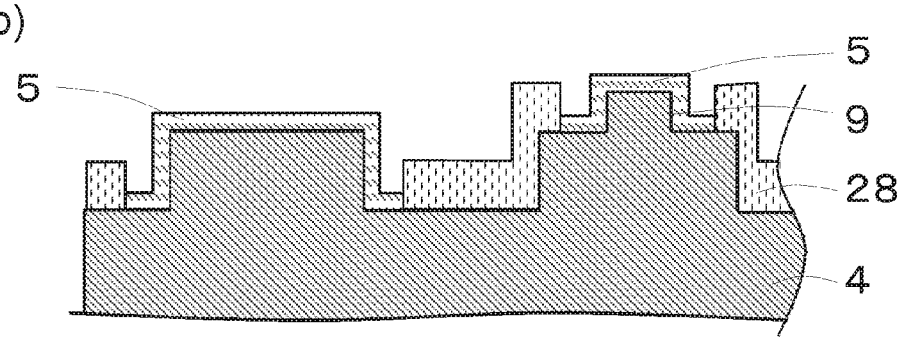
Figure 6C:
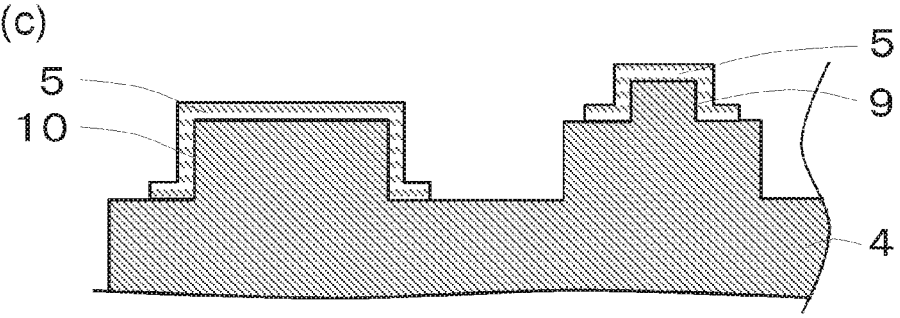

(3) The electrostatic chuck 1 is manufactured by forming the conductive film 5 on the base body 4 as shown in FIGS. 6(a) to 6(c). Specifically, this was carried out, for example, in the following manner.

As shown in FIG. 6(a), a third resist 28 made of a photocuring resin or the like is formed by using the photolithography method, which covers regions of the bottom surface 8, the second side surface 15, and the exposed part 18 of the step surface 14 on the first surface 3 of the base body 4.

Subsequently, as shown in FIG. 6(b), for example, a metal film is formed at portions exposed from the third resist 28 by using a film forming method, such as a PVD method, a CVD method, an evaporation method, an ion plating method, or a sputtering method. Thereby, the conductive film 5, the wiring line 41, and the conductive film 25 are formable, which are made of, for example, the metal film.

Subsequently, as shown in FIG. 6(c), the third resist 28 is removed from the base body 4. For example, the third resist 28 is removable by dissolving the third resist 28 made of the photocuring resin or the like in a solvent.

Thus, the conductive film 5 is formable on the first surface 3 of the base body 4. Consequently, the electrostatic chuck 1 shown in FIG. 1 is manufacturable.

The present invention is not limited to the foregoing embodiment and, for example, various changes, improvements, and combinations may be made without departing from the scope.

Figure 7:
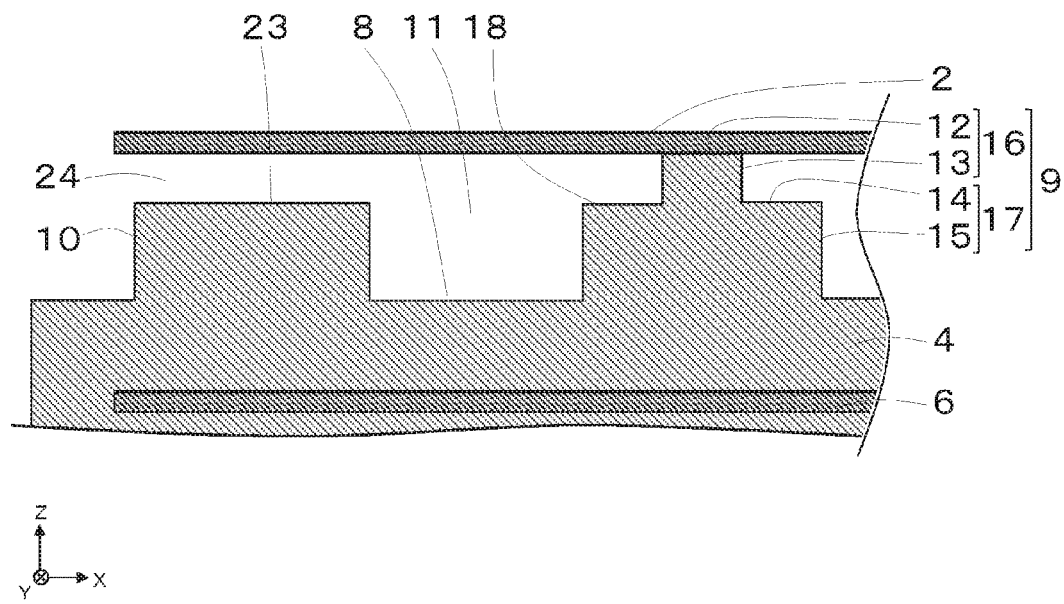
FIG. 7 is a partially enlarged view of a cross section taken along the thickness direction, which shows a situation where an object is adsorbed onto an electrostatic chuck according to other embodiment.

For example, the foregoing description has been made by exemplifying the configuration that the electrostatic chuck 1 includes the conductive film 5. As shown in FIG. 7, the electrostatic chuck 1 may not include the conductive film 5, and the first surface 3 may be exposed. In this case, the first top surface 12, the first side surface 13, and the step surface 14 in the protruding surface part 9 are exposed without being covered with the conductive film 5. The first top surface 12 of the protruding surface part 9 is directly brought into contact with the object 2. Even in this case, the adsorption force of the electrostatic chuck 1 with respect to the object 2 can be enhanced by the step surface 14. It is therefore possible to decrease the width (diameter) of the first top surface 12 while maintaining the adsorption force of the electrostatic chuck 1. This makes it possible to reduce the contamination of the object 2 due to the particles, and also enhance the flatness of the object 2. Compared with the foregoing embodiment, the entirety of the step surface 14 is exposed, thus further enhancing the adsorption force of the electrostatic chuck 1 with respect to the object 2.

The foregoing description has been made by exemplifying the configuration that the conductive film 5 is formed by forming the first resist 26 to the third resist 28 by using the photolithography method. Alternatively, a mask having a pattern formed on a metal plate made of, for example, stainless steel, or on a resin plate may be used instead of the first resist 26 to the third resist 28.

DESCRIPTION OF THE REFERENCE NUMERAL 1 electrostatic chuck
2 object
3 first surface
4 base body
5 conductive film
6 electrode
7 insertion hole
8 bottom surface
9 protruding surface part
10 peripheral edge convex surface part
11 space between first surface and object
12 first top surface of protruding surface part
13 first side surface of protruding surface part
14 step surface of protruding surface part
15 second side surface of protruding surface part
16 first section of protruding surface part
17 second section of protruding surface part
18 exposed part of step surface
19 first region of conductive film
20 second region of conductive film
21 third region of conductive film
22 fourth region of conductive film
23 second top surface of peripheral edge convex surface part
24 micro gap
25 second conductive film
26 first resist
27 second resist 28 third resist
D1 circumferential direction

The invention claimed is:

1. An electrostatic chuck comprising:
a base body having a first surface comprising a bottom surface and a protruding surface part protruding from the bottom surface, wherein the protruding surface part comprises a first top surface and a step surface disposed between the first top surface and the bottom surface; and
a conductive film covering at least a part of the first top surface,
wherein the protruding surface part comprises a first side surface that is connected to the first top surface and the step surface and that surrounds the first top surface over a circumferential direction, and wherein the conductive film comprises a first region that covers at least a part of the first top surface, and a second region that covers the first side surface over the circumferential direction and is connected to the first region, and
wherein the conductive film further comprises a third region that covers a region of the step surface which is close to the first side surface over the circumferential direction, and is connected to the second region.

2. The electrostatic chuck according to claim 1, wherein the step surface is surrounding the first top surface in a plan view.

3. The electrostatic chuck according to claim 1, wherein the conductive film further comprises a line-shaped fourth region that covers a part of a region of the step surface other than the region close to the first side surface, and is connected to the third region.

4. An electrostatic chuck comprising:
a base body having a first surface comprising a bottom surface and a protruding surface part protruding from the bottom surface, wherein the protruding surface part comprises a first top surface and a step surface disposed between the first top surface and the bottom surface,
wherein a distance between the first top surface and the step surface is 0.05 µm or more and 10 µm or less.

5. The electrostatic chuck according to claim 3, comprising a plurality of the protruding surface parts, wherein the fourth region of each of the protruding surface parts is connected to the fourth region of one or more others of the protruding surface parts.

6. The electrostatic chuck according to claim 5, wherein the first surface further comprises a peripheral edge convex surface part surrounding the protruding surface part and protrudes from the bottom surface.

7. The electrostatic chuck according to claim 6, wherein the peripheral edge convex surface part comprises a second top surface whose height from the bottom surface is identical to a height of the step surface from the bottom surface.

8. The electrostatic chuck according to claim 7, comprising a conductive film covering at least a part of the second top surface.

* * * * *